United States Patent [19]

Redwine et al.

[11] 4,031,415
[45] June 21, 1977

[54] ADDRESS BUFFER CIRCUIT FOR SEMICONDUCTOR MEMORY

[75] Inventors: Donald J. Redwine; Norishisa Kitagawa, both of Houston, Tex.

[73] Assignee: Texas Instruments Incorporated, Dallas, Tex.

[22] Filed: Oct. 22, 1975

[21] Appl. No.: 624,813

[52] U.S. Cl. .................... 307/279; 307/DIG. 3; 307/DIG. 4; 307/DIG. 5; 340/173 R

[51] Int. Cl.² ............... H03K 3/286; H03K 3/353; G11C 11/40; H03K 5/20

[58] Field of Search ........ 307/235 F, 235 H, 235 J, 307/235 T, 238, 279, DIG. 1, DIG. 3, DIG. 4, DIG. 5; 340/173 R, 173 DR

[56] References Cited
UNITED STATES PATENTS

| | | |
|---|---|---|
| 3,678,473 | 7/1972 | Wahlstrom ............... 307/DIG. 3 X |
| 3,796,893 | 3/1974 | Hoffman et al. ............. 307/DIG. 5 |
| 3,838,404 | 9/1974 | Heeren ..................... 307/DIG. 3 X |
| 3,848,237 | 11/1974 | Geilhufe et al. .............. 307/279 X |
| 3,902,082 | 8/1975 | Proebsting et al. ................ 307/279 |
| 3,906,464 | 9/1975 | Lattin ....................... 307/DIG. 3 X |
| 3,909,631 | 9/1975 | Kitagawa .......................... 307/238 |
| 3,949,381 | 4/1976 | Dennard et al. ............... 307/279 X |

Primary Examiner—John S. Heyman
Assistant Examiner—Larry N. Anagnos
Attorney, Agent, or Firm—Harold Levine; John G. Graham

[57] ABSTRACT

Disclosed is an address buffer circuit for use in semiconductor memories or the like which are implemented in MOS integrated circuits. A cross-coupled differential pair of MOS transistors is used to detect an address input during a short time window, and internal address signals are generated from the state of the cross-coupled pair.

21 Claims, 9 Drawing Figures

ADDRESS BUFFER CIRCUIT FOR SEMICONDUCTOR MEMORY

BACKGROUND OF THE INVENTION

Semiconductor integrated circuits have been found to have great advantages in computer memory. The cost per bit of storage and speed of operation provided by N-channel MOS random access memory (RAM) devices have resulted in wide acceptance thereof in the manufacture of digital equipment, particularly minicomputers. One example of such a device, a 4096 bit RAM, is shown and described in U.S. Pat. No. 3,909,631, filed Aug. 2, 1973 by Norishisa Kitagawa.

Typically, a semiconductor RAM accepts a multiple bit address from external circuitry, which address functions to select a specific cell (or cells) within the RAM for writing in data or reading out data. The address is generated by other parts of the system, separate from the RAM; a requirement placed on the circuitry of the RAM is that the timing and voltage levels or logic levels of the address signals which it responds to must be compatible with the remainder of the system. Often the logic levels in the system are dictated by bipolar or TTL operating voltages, rather than those of MOS devices. It is also most preferable that the address inputs to the RAM impose a minimum of current loading on the external circuits, and that a minimum of noise or unwanted voltage variations be generated by the address signal detecting circuitry. A major requirement of the address buffer circuitry is that it causes the memory device to be responsive to the address signals during only a small window in time during the operating cycle of the digital equipment, so that the address signals may change to set up the next access cycle before the existing cycle is completed. While the buffer circuit of the invention is described in reference to a RAM, it can find utility in other semiconductor memory devices, such as read only memories (ROM's), or other MOS circuits.

It is therefore the object of the invention to provide an improved circuit for detecting address signals or other logic levels in semiconductor memory devices or the like, particularly a circuit which is compatible in response timing, voltage level, and loading with the remainder of the system in which the device may be used.

SUMMARY OF THE INVENTION

In a specific embodiment of the invention, an address buffer is provided for a semiconductor memory by a pair of cross-coupled MOS transistors which function as a differential detector. The address input is coupled to one side of the differential pair by a transistor device. The drivers for the differential pair are of different size, and are biased on only during a certain time period. Being of different size, the drivers cause the pair to come on in one state when the address input is low, while a high input will cause the pair to turn on in the other state. The state of the cross-coupled pair is detected and address signals generated and latched, shortly after the signals are latched, then the address inputs may change without affecting the internal address signals.

THE DRAWINGS

The novel features believed characteristic of the invention are set forth in the appended claims; the invention itself, however, as well as other features and advantages thereof, may best be understood by reference to the following detailed description of a particular embodiment, when read in reference to the accompanying drawings, wherein:

DETAILED DESCRIPTION OF A SPECIFIC EMBODIMENT

The Memory System

Figure 1:
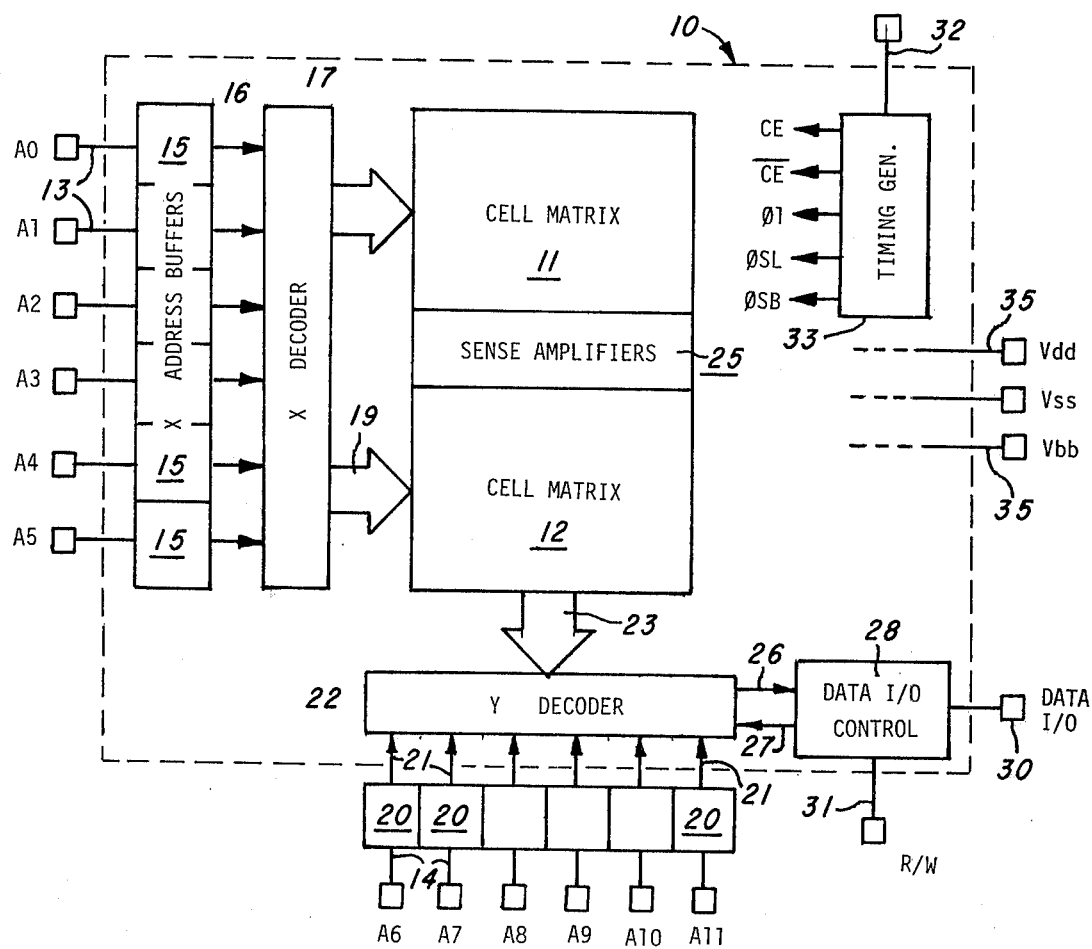
FIG. 1 is a block diagram of a semiconductor memory device which may utilize the invention.

Referring to FIG. 1, a semiconductor memory device which may utilize the invention is illustrated in block diagram form. The memory device is incorporated within a semiconductor chip or bar 10 which may be an N-channel, silicon gate MOS/LSI device mounted in an 18-pin plastic "dual-in-line" package in accordance with standard practice within this industry. The chip 10 includes 4096 memory cells which are arranged in two cell matrixes 11 and 12, each of which contains 2048 cells. The 4096 cells are in an array of 64 rows and 64 columns; the cell matrix 11 contains rows XO to X31 while the cell matrix 12 contains rows X32 to X63; columns YO to Y63 are contained in both cell matric 11 and cell matrix 12. Only one cell of the 4096 cells is addressed at a given time; this requires a six-bit (one of 64) X address which is applied to X address pins 13 labelled AO to A5, as well as a six-bit (one of 64) Y address applied to Y address pins 14 labelled A6 to All.

The X address is applied from pins 13 to six X address buffers 15 (constructed according to the invention) which generate six address signals and their complements on lines 16 to be applied to an X decoder 17 that may be of conventional form. The X decoder 17 provides selection of 1-of-32 row address lines 18 going to cell matrix 11 or 1-of-32 row address lines 19 going to cell matrix 12. In addition, selection of dummy cells in the non selected matrix is provided by the X decoder according to U.S. Pat. No. 3,909,631.

In like manner, the Y address is applied from pins 14 to six Y address buffers 20 (constructed according to the invention) which generate six binary address signals and their complements on lines 21 to be applied to a Y decoder 22 which may be of the type described in U.S. Pat. No. 3,909,631. The Y decoder 22 provides selection of 1-of-64 column lines 23 which are the column lines within the cell matrixes 11 and 12. Each column line is bisected by one of a set of 64 sense amplifiers 25 which function to detect the low level signals produced by the memory cells and provide a full logic level readout for refresh or system output. The Y decoder 22 also provides input/output selection, and data input and output lines 26 and 27 connect to a data I/O control circuitry 28 and thence to a data I/O pin 30. Another pin 31 provides read/write (R/W) select. The basic timing signal for the chip 10 is provided by a CE (chip enable) input pin 32 which is connected to timing generator circuitry 33. Various clock pulses such as CE, $\overline{CE}$, 01, etc., used within the chip are produced by the circuitry 33, based on the CE input. Supply voltages for the chip 10 are provided by input pins 35 for Vdd which is about +12 volts, ground or Vss, and substrate bias Vbb, which is about −5 volts.

System Timing

Figure 2:
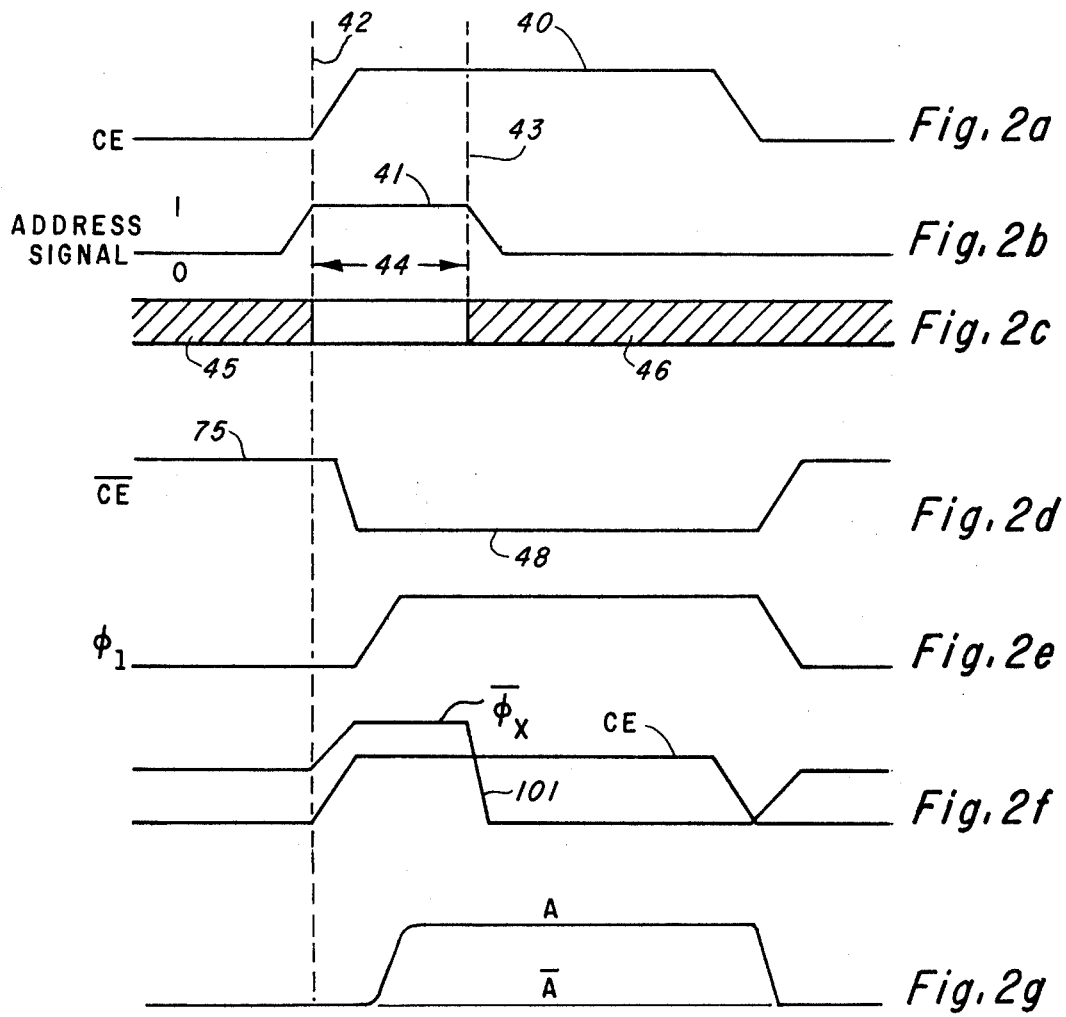
FIG. 2a – 2g are graphic representations of voltages appearing at various points in the circuit of the invention, plotted as a function of time.

Referring to FIGS. 2a to 2f, the timing for the system of FIG. 1 is illustrated. The basic clock CE is shown in FIG. 2a as a line 40; this CE pulse 40 is about 300 ns in width and recurs at a rate of about 2 MHZ. An address signal 41 as may be present on any one of the AO to A11 lines 13 and 14 is seen in FIG. 2b; this signal must be valid at a time 42 which represents the beginning of the CE pulse 40. The address signal 41 may change at any time prior to the time 42, as the address buffer circuits 15 and 20 of the invention will not respond to it prior to time 42. The address signal 41 must remain valid for a period between time 42 and a time 43 which represents a fraction of the length of the CE pulse 40. The interval 44 between 42 and 43 is perhaps 150 ns, although this will depend upon system and circuit design. After time 43, the address signals may change; for example, the address for the next access cycle as may occur during the next CE pulse, may begin to be set up. By making the time 44 short, the constraints on the memory system design are lessened. As seen in FIG. 2C, the specification for the address signal may be considered to include a time 44 during which the address must be valid, with the time 45 prior to this and the time 46 after this being "don't care" conditions.

FIG. 2d shows the $\overline{CE}$ pulse 48, which is generated in the circuitry 33; $\overline{CE}$ is approximately the complement of CE. In FIG. 2e, the recurring pulse 01 is shown; which is likewise generated by conventional means within the circuitry 33; the 01 pulse resembles CE, but its leading edge is slightly delayed. FIG. 2f shows a pulse $\overline{0x}$ which is generated for use in the buffer circuit of the invention as will be described; the $\overline{0x}$ pulse in shown superimposed on a CE pulse, where it is seen to begin to rise at the time of the leading edge of CE, go to a higher voltage level than CE, then terminate at about the time 43. FIG 2g shows the address output signals A and $\overline{A}$ which occur on the lines 16 or 21 in FIG. 1, at the output of the address buffers of the invention; these are seen to begin slightly after 01.

The Address Buffer Circuit

Figure 3:
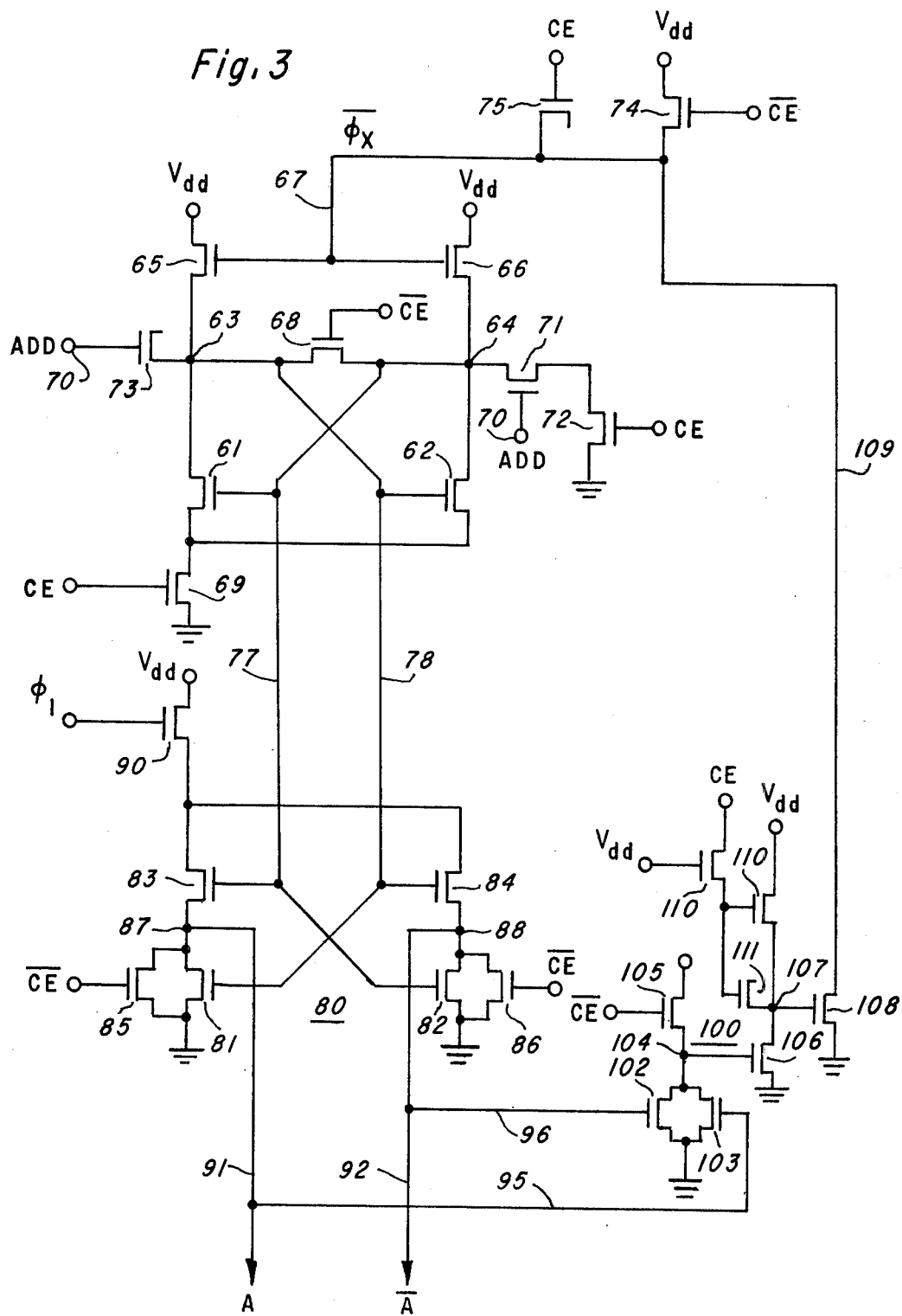
FIG. 3 is an electrical schematic diagram of the circuit of the invention.

Referring to FIG. 3, an address buffer circuit according to the invention is illustrated. The upper part of the circuit is an address signal detector which comprises a pair of cross-coupled MOS transistors 61 and 62 providing a differential sense amplifier of the flip-flop type. A pair of nodes 63 and 64 are connected to the drains of the transistors 61 and 62 and to Vdd through transistors 65 and 66. The gates of transistors 65 and 66 are both connected to a line 67 upon which a signal referred to as $\overline{0x}$ appears, as will be defined. The nodes 63 and 64 are connected together by an equalizer transistor 68 which has $\overline{CE}$ applied to its gate. The sources of the transistors 61 and 62 are connected together and to the drain of transistor 69, which has its source connected to ground. The gate of the transistor 69 is connected to the CE pulse source.

The address signal appears at a terminal 70, which may be any one of the pins 13 or 14 of FIG. 1. The terminal 70 is connected to the gate of a transistor 71, which has its drain-source path connected in series between the node 64 and ground through a transistor 72. The gate of the transistor 72 is connected to the CE pulse source.

The address signal on the terminal 70 is also applied to one side of a gated capacitor 73 which is coupled to the node 63, functioning merely to apply a transient signal to node 63 of the same magnitude as the signal applied to the node 64 due to the capacitance of the gate of transistor 71. The magnitude of the capacitor 73 is the same as the capacitance from gate to drain of the transistor 71. The device 73 is a MOS capacitor of the same size and construction as the MOS transistor 71, and functions merely as a noise compensator.

The line 67 is connected to Vdd through a transistor 74 which has $\overline{CE}$ applied to its gate; while $\overline{CE}$ is positive the voltage level on line 67 will be Vdd − Vt, so the voltage level on the gates of transistor 65 and 66 will be such that a considerable drop from Vdd will occur at nodes 63 and 64 during $\overline{CE}$. When CE comes on, the voltage level on the line 67 goes higher than Vdd due to the action of a gated capacitor 75 which is connected between the line 67 and a source of the CE clock; thus, the transistors 65 and 66 are driven to an operating condition of very little voltage drop during CE, since $\overline{0x}$ goes higher than Vdd as seen in FIG. 2f.

In operation, the circuit of transistors 61 and 62, during the highest part of $\overline{0x}$ is likened to a flip-flop in that one of the transistors 61 and 62 will be conducting and the other cut off. If the ADD signal is at logic level 1, or a positive voltage of over about 2.4 volts (compatible with TTL logic 1 level), the transistor 62 will be conductive and the transistor 61 cut off. This occurs because so long as $\overline{CE}$ is positive the voltage at the nodes 63 and 64 are balanced via transistor 68, but as CE goes positive on the gate of transistor 72 and logic 1 is on the gate of transistor 71, a small amount of charge will begin to flow from node 64 to ground via transistors 71 and 72. Thus, as the nodes 63 and 64 are connected to Vdd via transistors 65 and 66 as $\overline{0x}$ goes highly positive as seen in FIG. 2f, and at the same time as the sources of transistors 61 and 62 are connected to ground through the transistor 69 due to CE on its gate, a condition exists whereby both transistors 61 and 62 could potentially become conductive but of course they cannot due to the drain-to-gate cross-coupling. So, as the node 64 is unbalanced toward the low side via transistors 71 and 72 when ADD is a logic 1, transistor 61 tends to turn off and transistor 62 tends to turn on. This effect is cumulative and the circuit quickly goes to a stable state with transistor 62 full on and 61 full off. On the other hand, if ADD is a logic 0 or at a voltage of about ground, the transistor 71 will not conduct at all, so no charge will be drawn off at node 64. To assure that the cross-coupled pair 61 and 62 is not indeterminate under this condition, the transistor 61 is of perhaps 10% larger channel width than the transistor 62, so that it will tend to turn on preferentially. Thus, for a logic 0 input, the transistor 61 will be conductive and the transistor 62 cut off.

The circuitry thus far described may be considered to be the address signal detector, for which the output is the voltages appearing on the nodes 63 and 64. These output voltages are connected by lines 77 and 78 to an address signal generator circuit 80 which includes a pair of transistors 81 and 82 along with load transistors 83 and 84. Thus, the voltage on the node 64 is applied via line 77 to the gates of transistors 82 and 83, and the voltage on the node 63 is connected via line 78 to the gates of transistors 81 and 84. The transistors 81 and 82 are shunted by transistors 85 and 86, respectively, which have their gates connected to $\overline{CE}$, so nodes 87 and 88 at the drains of the transistors 81 and 82 will be at ground at all times when $\overline{CE}$ is positive. These nodes 87 and 88 represent the A and $\overline{A}$ signals (seen in FIG. 2g) on lines 16 or 21 of FIG. 1, and are connected via lines 91 and 92 to the X or Y decoders 17 or 22, as the case may be. Until 01 goes positive, the circuit 80 is unresponsive to changes in the voltages on nodes 63 and 64 due to a transistor 90 connected in series between the drains of the transistors 83 and 84 and V$dd$; the gate of transistor 90 is connected to 01 which is CE delayed as seen in FIG. 2e.

The A and $\overline{A}$ output lines are further connected via lines 95 and 96 to a circuit 100 which functions solely to define the trailing edge 101 to the $\overline{0}$x pulse as seen in FIG. 2f. That is, the circuit 100 terminates the $\overline{0}$x pulse after the A and $\overline{A}$ signals have been generated so that the address buffer will be no longer responsive to changes in the address signal inputs at terminal 70. The lines 95 and 96 are connected to the gates of transistors 102 and 103 which define a NOR gate. A node 104 is changed to Vdd when $\overline{CE}$ is positive by a transistor 105, so a transistor 106 will be full on during $\overline{CE}$. Thus, a node 107 will be at close to ground during $\overline{CE}$, and so a transistor 108 will be off. This transistor 108 is connected to the $\overline{0}$x line 67 via a line 109. When CE goes positive, an arrangement including two transistor 110 and a gated capacitor 111 tends to drive the node 107 positive, but the node is held near ground by transistor 106 until the node 104 is discharged. When an address signal A or $\overline{A}$ goes positive, one of the transistors 102 and 103 turns on, driving the node 104 to ground and turning off the transistor 106. This allows the node 107 to charge positive very rapidly from CE and Vdd, turning on the transistor 108 and driving the line 67 or $\overline{0}$x to ground very rapidly, producing the trailing edge 101 of the $\overline{0}$x pulse.

Although the invention has been described with reference to an illustrative embodiment, the description is not meant to be construed in a limiting sense. Modfications of the disclossed embodiment, as well as other embodiments of the invention, will occur to persons skilled in the art. It is therefore contemplated that the appended claims will cover any such modifications or embodiments as fall within the true scope of the invention.

What is claimed is:

1. An input buffer circuit for an address input of a semiconductor memory device, comprising:
   a pair of driver transistors substantially unbalanced in size and characteristic, each driver transistor having a control electrode and two output electrodes, the driver transistors being cross coupled by connection of the control electrode of each to an output electrode of the other,
   a pair of load transistors, one for each of the driver transistors, the load transistors being substantially balanced in size and characteristic, each of the load transistors being connected in series with one of the driver transistors and a supply voltage,
   means connected to turn on the pair of load transistors at a given time and to turn off the load transistors after a preselected period;
   means to short output electrodes of the pair of cross coupled driver transistors together to equalize the voltages on such output electrodes prior to said given time;
   means connected to one of the output electrodes of one of said pair of cross-coupled driver transistors to couple said one of the output electrodes to a reference potential when said address input is present during said preselected period; and
   a pair of address signal output circuits, each of which has an input connected to an output electrode of a different one of the pair of cross-coupled driver transistors and responsive to the voltage level thereof during said preselected period but delayed by a specified period after said given time, one of the pair of address signal output circuits producing an address signal and the other producing the complement of the address signal during a period of time beginning after said specified period.

2. An input buffer circuit according to claim 1 wherein the output electrodes of each of said pair of cross-coupled driver transistors are source and drain electrodes and the control electrode is a gate, and the drain electrode of each is directly coupled to the gate of the other.

3. An input buffer circuit according to claim 2 wherein each of the pair of load transistors has a source, a drain and a gate, and the source of each is directly connected to the drain electrode of a different one of the pair of cross-coupled driver transistors.

4. An input buffer circuit according to claim 3 wherein the gates of the pair of load transistors are both connected to first pulse generating means, and the drains of the pair of load transistors are each connected to a supply voltage source.

5. An input buffer circuit according to claim 4 wherein the first pulse generating means provides recurring pulses which are active for said preselected period beginning at said given time during each cycle of recurrence.

6. An input buffer circuit according to claim 5 wherein the means to short the output electrodes of the cross-coupled driver transistors comprises an MOS transistor having a source-drain path connected between the drain electrode of one of the pair of cross-coupled driver transistors and the drain electrode of the other of the pair, and having a gate connected to a source of recurring pulses which terminate at about said given time during each cycle of recurrence.

7. An input buffer circuit according to claim 6 wherein the means to couple said one output electrode of one of the pair of cross-coupled driver transistors to a reference potential comprises two MOS transistors having their source-drain paths connected in a series path between the drain of one of the pair of cross-coupled driver transistors and reference potential.

8. An input buffer circuit according to claim 7 wherein one of the two MOS transistors has its gate connected to address input terminal; and the other of the two has its gate connected to a source of recurring pulses which are active beginning at about said given time during each cycle of recurrence.

9. An input buffer circuit according to claim 8 wherein said one of the two MOS transistors exhibits a capacitance of a given magnitude, and the address input terminal is coupled to the drain of the other of said pair of cross-coupled driver transistors by capacitive means of substantially the same magnitude as that of said one of the two MOS transistors.

10. An input buffer circuit according to claim 6 wherein the pair of address signal output circuits each comprises first, second and third MOS transistors each of which has a source, a drain and a gate, the source-drain paths of the first and second transistors being connected in series between a supply line and a reference potential and the source-drain path of the third transistor being connected in parallel with the source-drain path of the second transistor.

11. An input buffer circuit according to claim 10 wherein the input of each of the address signal output circuits comprises a connection from the drain of a different one of the pair of cross-coupled driver transistors to the gate of the first transistor in one of the output circuits and to the gate of the second transistor in the other of the output circuits.

12. An input buffer circuit according to claim 11 wherein the gates of the third transistors in each of the output circuits are both connected to said source of recurring pulses which terminate at about said given time during each cycle of recurrence.

13. An input buffer circuit according to claim 12 wherein said supply line is connected to said supply voltage source through the source-drain path of an MOS transistor which has its gate connected to a source of recurring pulses which are active during a period of time beginning after said specified period in each cycle of recurrence.

14. An input buffer circuit according to claim 13 wherein the address signal and the complement of the address signal are produced at the node between the first and second MOS transistors in the pair of address signal output circuits.

15. An input buffer circuit according to claim 14 wherein means, having an input connected to receive the address signal and the complement of the address signal and having an output coupled to said first pulse generating means, is operative to terminate said recurring pulses after said preselected period.

16. An input buffer circuit according to claim 1 wherein feedback means responsive to the occurence of the address signal and the complement of the address signal from the address signal output circuits produces an input to the means connected to turn on and turn off the pair of load transistors.

17. An input buffer circuit according to claim 1 wherein the means connected to turn on and turn off the pair of load transistors is responsive to the operation of the address signal output circuits.

18. An input buffer circuit according to claim 1 wherein means connected to turn off the load transistors after a preselected period is responsive to the occurence of an address signal at said address signal output circuit.

19. An input latch for a semiconductor integrated circuit of the type employing insulated gate field effect transistors, comprising:
   a pair of driver transistors unbalanced in characteristic, each driver transistor having a source-drain path and a gate,
   a pair of load transistors each having a source-drain path and a gate,
   means connecting the source-drain path of each of the driver transistors in series with the source-drain path of a different one of the load transistors and connecting each series-connected driver and load transistor across supply voltage means,
   a pair of output nodes, one between each of the series-connected source-drain paths of the driver and load transistors,
   cross-coupling means connecting each output node to the gate of the other driver transistor,
   means connected to the gates of the load transistors to turn on the load transistors at a first selected time in an operating cycle, but to turn off the load transistors at a second selected time,
   means connected to the pair of output nodes to equalize the voltages thereon prior to said first selected time in an operating cycle,
   means connected to one of the output nodes to couple such node to a reference potential when an input signal is present at a time beginning at said first selected time in an operating cycle,
   signal output circuit means having input means coupled to at least one of the output nodes and responsive to the voltage thereon beginning at a third selected time which is after the first selected time but prior to the second selected time in an operating cycle, the signal output circuit means producing a signal during a period of time beginning after said third selected time during an operating cycle.

20. An input latch according to claim 19 wherein the second selected time is determined by and occurs after the third selected time.

21. An input latch according to claim 19 wherein the means connected to the gates of the load transistors operates to cut off the load transistors in response to the occurence of the signal produced by the signal output circuit means.

* * * * *